United States Patent [19]

Mori et al.

[11] Patent Number: 5,532,961
[45] Date of Patent: Jul. 2, 1996

[54] SEMICONDUCTOR MEMORY DEVICE HAVING EXTENDED DATA OUT FUNCTION

[75] Inventors: Shigeru Mori; Tomio Suzuki; Masanori Hayashikoshi, all of Hyogo, Japan

[73] Assignee: Mitsubishi Denki Kabushiki Kaisha, Tokyo, Japan

[21] Appl. No.: 345,758

[22] Filed: Nov. 22, 1994

[30] Foreign Application Priority Data

Dec. 21, 1993 [JP] Japan .................................. 5-321557

[51] Int. Cl.$^6$ .................................................. G11C 7/00
[52] U.S. Cl. ........................... 365/189.05; 365/189.08; 365/189.11; 365/193; 365/194; 365/227; 365/228; 365/233; 326/28; 326/57
[58] Field of Search ........................ 365/189.05, 189.08, 365/189.11, 193, 194, 227, 228, 233; 326/26, 27, 28, 56, 57, 58

[56] References Cited

U.S. PATENT DOCUMENTS 5,058,066  10/1991  Yu ........................ 365/189.05
5,210,715   5/1993  Houston .................... 365/194
5,457,659  10/1995  Schaefer .................... 365/222

FOREIGN PATENT DOCUMENTS 62-12210  1/1987  Japan .
3-23714   1/1991  Japan .
3-124120  5/1991  Japan .
3-185921  8/1991  Japan .

*Primary Examiner*—David C. Nelms
*Assistant Examiner*—Andrew Q. Tran
*Attorney, Agent, or Firm*—Lowe, Price, LeBlanc & Becker

[57] ABSTRACT

A DRAM includes an output terminal, a memory cell array having a plurality of memory cells, a row decoder, a column decoder, an input/output circuit, a data extending circuit, an output buffer circuit, and a control circuit. The data extending circuit extends each data read out from the input/output circuit until a subsequent data is read out. The output buffer circuit responds to the extended data from the data extending circuit for providing output data sequentially to the output terminal. In response to an output control signal provided from the control circuit, the output terminal is set to a high impedance state before each output data is provided from the output buffer circuit.

7 Claims, 12 Drawing Sheets

(a) int. $\overline{RAS}$ (b) int. $\overline{CAS}$ (c) $\phi A$ (d) $\phi C$ (e) NO1

(f) NO2

(g) Dout

SEMICONDUCTOR MEMORY DEVICE HAVING EXTENDED DATA OUT FUNCTION

BACKGROUND OF THE INVENTION

1. Field of the Invention

The present invention relates to semiconductor memory devices, and more particularly, to improvement of a semiconductor memory device having an EDO (Extend Data Out) function.

2. Description of the Background Art

In recent years, various technical developments have been made to improve the data read out speed in a dynamic random access memory (DRAM) which is one semiconductor memory device. General semiconductor integrated circuit devices employ an EDO operation (also referred to as hyper-page operation) to comply with increase in the speed of a read out operation.

The EDO operation includes the step of latching a currently output data until the next data is output, and providing the currently output data. Such an EDO operation can be employed in a DRAM to comply with the high speed read out operation.

FIG. 12 is a block diagram showing a partial structure of a DRAM that carries out an EDO operation. FIG. 12 is provided for the purpose of describing the problems solved by the present invention, and does not show prior art.

Referring to FIG. 12, this DRAM includes a data extending circuit 1, an output buffer circuit 2, a control circuit 3, and an output terminal 6.

Although not shown, this DRAM further includes a plurality of memory cells, each storing 1 bit of data, a row decoder and a column decoder for selecting one of the memory cells, a timing generator responsive to an external control signal for generating an internal control signal, and a preamplifier circuit for amplifying data read out from a selected memory cell.

Data extending circuit 1 responds to an extend control signal φB from control circuit 3 to receive data RDF read out from a memory cell to provide the same as data RD, and latching and outputting that data RD.

Output buffer circuit 2 includes two N channel MOS transistors Q1 and Q2 connected in series between a power supply node and a ground node, inverters I1 and I3 connected to the gate electrodes of transistors Q1 and Q2, respectively, NAND gates G1 and G2 connected to inverters I1 and I3, respectively, and an inverter I2 connected only to one NAND gate G2.

NAND gate G1 receives data RD at its one input terminal. NAND gate G2 receives data RD via inverter I2 at its one input terminal. The other input terminals of NAND gates G1 and G2 receive an output control signal φA from control circuit 3. The common node of transistors Q1 and Q2 is connected to an output terminal 6.

Output buffer circuit 2 responds to output control signal φA from control circuit 3 to be activated, whereby data RD output from data extending circuit 1 is amplified and output via output terminal 6.

Control circuit 3 includes an extend control circuit 4 responsive to an internal row address strobe signal int. $\overline{RAS}$, an internal column address strobe signal int. $\overline{CAS}$, an internal output enable signal int. $\overline{OE}$, and an internal write enable signal int. $\overline{WE}$ generated by a timing generator (not shown) for generating an extend control signal φB, and an output control circuit 5 responsive to the same control signals int. $\overline{RAS}$, int. $\overline{CAS}$, int. $\overline{OE}$ and int. $\overline{WE}$ for generating output control signal φA.

A page mode operation of this DRAM will be described hereinafter with reference to the timing chart of FIG. 13.

In a page mode operation, internal column address strobe signal int. $\overline{CAS}$ falls and rises several times during one fall and rise of internal row address strobe signal int. $\overline{RAS}$ as shown in (a) and (c) in FIG. 13.

When internal row address strobe signal int. $\overline{RAS}$ falls, a row address Row input as address signals A0–An shown in FIG. 13(b) is strobed. Then, when internal column address signal int. $\overline{CAS}$ falls, a column address Col. 1 input as address signals A0–An is strobed.

As a result, one of the plurality of memory cells is selected. As shown in FIG. 13(d), data D1 stored in the selected memory cell is output via output terminal 6 as output data Dout. Similarly, data D2, D3, . . . from the memory cells of different column addresses Col. 2, Col. 3, . . . of same row address Row are output.

In a conventional DRAM, each data D1, D2 and D3 begins to be output in response to a fall of internal column address strobe signal int. $\overline{CAS}$, and the output of each data D1, D2, D3 ends in response to a rise of internal column address strobe signal int. $\overline{CAS}$, as shown in (b)–(d) of FIG. 13.

As shown in (e)–(i) of FIG. 13, the period Tex of column address strobe signal int. $\overline{CAS}$ is set shorter than the period Tst shown in FIG. 13(c) to comply with the high speed read out operation.

If data is to be output in response to a fall and rise of an internal column address strobe signal int. $\overline{CAS}$ as in a conventional case, the output time period of data D1, D2, D3, . . . becomes shorter. It is therefore difficult to obtain valid data.

The DRAM shown in FIG. 12 is formed so that data is continuously latched and output until the next data is output.

More specifically, in the above DRAM, output control signal φA generated by output control circuit 5 rises to a H level (logical high) after a predetermined time period from the fall of both internal row and column address strobe signals int. $\overline{RAS}$ and int. $\overline{CAS}$ to a L level (logical low). This output control signal φA is maintained at a H level until internal row and column address strobe signals int. $\overline{RAS}$ and int. $\overline{CAS}$ both rise to a H level.

Extend control signal φB generated by extend control signal 4 rises and falls in response to the fall and rise, respectively, of internal column address strobe signal int. $\overline{CAS}$.

When extend control signal φB rises, data extending circuit 1 provides data RDF read out from a memory cell directly as data RD. In response to the rise of output control signal φA, output buffer circuit 2 is activated. Data RD output from data extending circuit 1 is applied to the gate electrode of transistor Q1 via NAND gate G1 and inverter I1, and is also inverted by inverter I2. The inverted data $\overline{RD}$ is applied to the gate electrode of transistor Q2 via NAND gate G2 and inverter I3.

As a result, one of transistors Q1 and Q2 is rendered conductive according to data RD, and the other of transistors Q1 and Q2 is rendered nonconductive. Therefore, data Dout of a logic level identical to that of data RD is output via output terminal 6.

When extend control signal φB falls, data extending circuit 1 continues to latch and output data RD. This data RD is output by output buffer circuit 2 via output terminal 6.

When extend control signal φB rises again, data extending circuit 1 receives the next data RDF and provides the same as data RD.

When output control signal φA attains a L level, output buffer circuit 2 is deactivated, whereby a signal of a L level is applied to the gate electrodes of transistors Q1 and Q2, and the common node of transistors Q1 and Q2 attains a floating state. Therefore, output terminal 6 is rendered to a high impedance state Hi-Z.

Because the above-described DRAM carrying out an EDO operation has data extended and output until the next data is output, valid data can easily be obtained.

However, in the above-described DRAM carrying out an EDO operation, output data Dout is extended until the next output data Dout is output. Therefore, output data Dout is fully oscillated instantaneously from a H level to a L level, or from a L level to a H level.

Therefore, there was a problem of ringing R occurring at the beginning of output data Dout, as shown in FIG. 13(i). Because valid output data Dout cannot be obtained until output data Dout becomes stable after this ringing disappears, the read out speed was not substantially increased even though the read out speed was improved by an EDO operation.

Japanese Patent Laying-Open No. 62-12210 and Japanese Patent Laying-Open No. 3-185921 disclose a CMOS type output buffer circuit of a semiconductor integrated circuit device wherein an output signal falls to a L level from a H level or rises to a H level from a L level respectively via a high impedance state.

Also, Japanese Patent Laying-Open No. 3-124120 discloses an output buffer circuit wherein an output signal attaining a H level or a L level is temporarily set to an intermediate level.

Furthermore, Japanese Patent Laying-Open No. 3-23714 discloses an output buffer circuit of an integrated circuit wherein output nodes of two output circuits are connected. The output node is charged in a step-like manner by each output circuit, whereby an output signal thereof temporarily attends an intermediate level when transmitting between an H level and a L level.

All of these are related to an output buffer circuit in a general semiconductor integrated circuit device. In contrast, the present invention is based on a semiconductor memory device such as a DRAM that carries out an EDO operation, and relates to an output buffer circuit thereof.

SUMMARY OF THE INVENTION

An object of the present invention is to provide a semiconductor memory device including an EDO function.

Another object of the present invention is to provide a semiconductor memory device in which ringing occurring at the beginning of output data is reduced.

A further object of the present invention is to provide a semiconductor memory device having data read out speeded.

Still another object of the present invention is to provide a semiconductor memory device having low power consumption.

A semiconductor memory device according to an aspect of the present invention includes an output terminal, a plurality of memory cells, a read out circuit, an extending circuit, a providing circuit, and a high impedance state rendering circuit. Each of the plurality of memory cells store 1 bit of data therein. The read out circuit sequentially reads out data stored in a memory cell. The extending circuit extends each data read out from the read out circuit. The providing circuit responds to extended data from the extending circuit to sequentially provide output data to the output terminal. The high impedance state rendering circuit renders the output terminal to a high impedance state before each data is provided by the providing circuit.

A semiconductor memory device according to another aspect of the present invention includes an output terminal, a plurality of memory cells, a read out circuit, an extending circuit, a providing circuit, and an intermediate level rendering circuit. Each of the plurality of memory cells store data of a first or second logic level therein. The read out circuit sequentially reads out data stored in a memory cell. The extending circuit extends each data read out from the read out circuit. The providing circuit responds to extended data from the extending circuit to sequentially provide output data to the output terminal. The intermediate level rendering circuit renders the potential of the output terminal to an intermediate level which is a level between the first and second logic levels before each data is provided by the providing circuit.

According to the semiconductor memory device of the one aspect of the present invention, data stored in a memory cell is sequentially read out. Each of the read out data is extended until the next data is read out. In response to the extended data, the output data is sequentially provided to the output terminal. Before each output data is provided, the output terminal is rendered to a high impedance state. As a result, output data is always provided via a high impedance state. Therefore, ringing does not occur at the beginning of the data. Furthermore, because each output data is continuously output right until the next output data begins to be provided, valid data can easily be obtained even when the data read out speed is increased.

According to the semiconductor memory device of the another aspect of the present invention, data stored in a memory cell is sequentially read out. Each of the read out data is extended until the next consequent data is read out. In response to the extended data, output data is provided sequentially to the output terminal. Before each output data is provided, the potential of the output terminal is set to an intermediate level. As a result, output data is always provided via an intermediate level. Therefore, ringing does not occur at the beginning of the output data. Furthermore, because each output data is continuously provided right until the next subsequent output data begins to be output, valid data can easily be obtained even when the data read out speed is increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
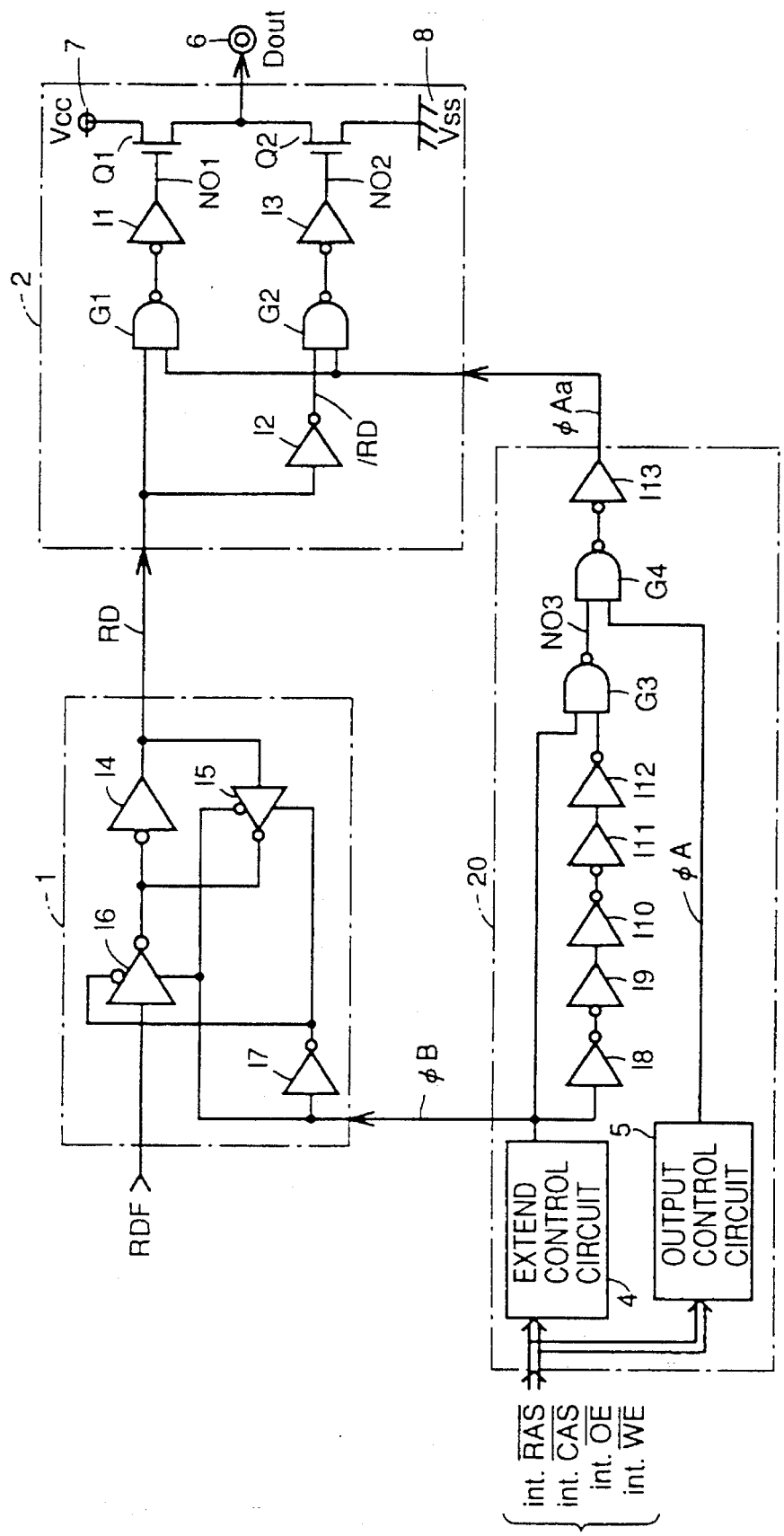
FIG. 1 is a block diagram showing the main structure of a DRAM according to Embodiment 1 of the present invention.

The embodiments of the present invention will be described in detail hereinafter with reference to the drawings. The same reference characters in the drawings indicate the same or corresponding elements.

[Embodiment 1]

Figure 2:
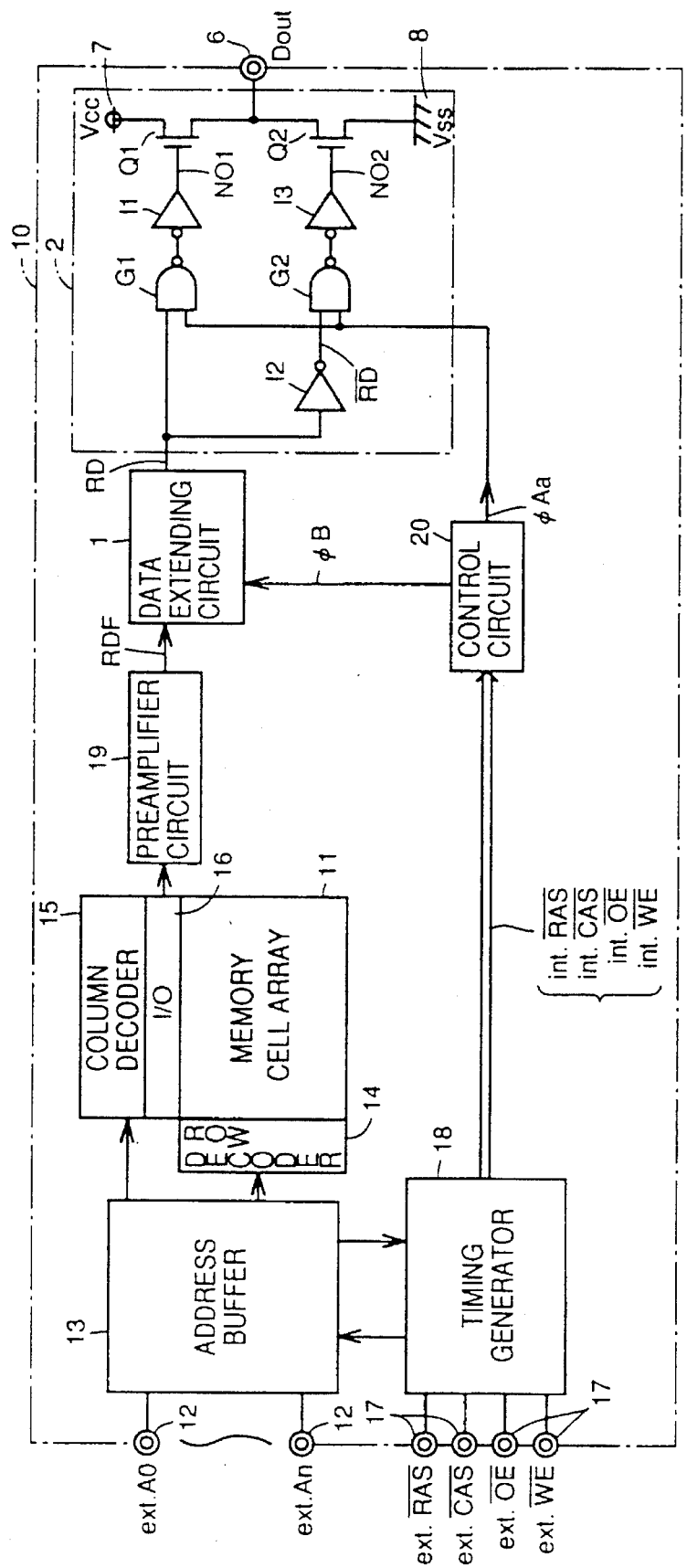
FIG. 2 is a block diagram showing the entire structure of the DRAM of FIG. 1.

FIG. 2 is a block diagram showing the entire structure of a DRAM according to Embodiment 1 of the present invention. FIG. 1 is a block diagram showing in detail the structure of data extending circuit 1, output buffer circuit 2, and control circuit 20 of the DRAM of FIG. 2.

Referring to FIG. 2, a DRAM 10 according to Embodiment 1 of the present invention includes a memory cell array 11 having a plurality of memory cells arranged in a matrix, an address terminal 12 for receiving an external address signal ext. A0–An, an address buffer 13 responsive to external address signals ext. A0–An for generating an internal address signal, a row decoder 14 responsive to an internal address signal for selecting one row of memory cell array 11, a column decoder 15 responsive to an internal address signal for selecting one column out of memory cell array 11, and an input/output circuit 16 for reading out data from a memory cell selected by row and column decoders 14 and 15 and for writing data into a selected memory cell.

This DRAM further includes a control terminal 17 for receiving an external row address strobe signal ext. $\overline{RAS}$, an external column address strobe signal ext. $\overline{CAS}$, an external output enable signal ext. $\overline{OE}$ and an external write enable signal ext. $\overline{WE}$, a timing generator 18 responsive to these control signals ext. $\overline{RAS}$, ext. $\overline{CAS}$, ext. $\overline{OE}$, and ext. $\overline{WE}$ for generating an internal row address strobe signal int. $\overline{RAS}$, internal column address strobe signal int. $\overline{CAS}$, internal output enable signal int. $\overline{OE}$ and internal write signal int. $\overline{WE}$, and a preamplifier circuit 19 for amplifying data output from input/output circuit 16.

This DRAM further includes a control circuit 20 responsive to internal control signals int. $\overline{RAS}$, int. $\overline{CAS}$, int. $\overline{OE}$, int. $\overline{WE}$ for generating an output control signal φAa and an extend control signal φB, a data extending circuit 1 responsive to extend control signal φB for extending data RDF output from preamplifier circuit 19 to output the same as data RD, and an output buffer circuit 2 activated in response to output control signal φAa to receive data RD provided from data extending circuit 1 for outputting the same via output terminal 6 as output data Dout.

Referring to FIG. 1, data extending circuit 1 includes four inverters I4–I7. Here, inverters I4 and I5 form a latch circuit. When extend control signal φB of a L level is applied, inverter I5 is activated, whereby inverters I4 and I5 latch data RDF which was applied thereto. At the same time, inverter I6 is deactivated, so that input of data RDF into the latch circuit is prevented.

When extend control signal φB of a H level is applied, inverter I5 is deactivated, whereby this latch circuit is reset. At the same time, inverter I6 is activated, whereby data RDF applied to data extending circuit 1 is output as data RD via inverters I6 and I4. In other words, data RDF passes through inverters I6 and I4.

Output buffer circuit 2 includes two N channel MOS transistors Q1 and Q2 connected in series between a power supply node 7 and a ground node 8, a NAND gate G1 and an inverter I1 connected in series to the gate electrode of N channel MOS transistor Q1, and an inverter I2, a NAND gate G2 and an inverter I3 connected in series to the gate electrode of N channel MOS transistor Q2. Power supply potential vcc is supplied to power supply node 7. Ground potential Vss is supplied to ground node 8. The source electrode of transistor Q1 and the drain electrode of transistor Q2 are connected to each other, and also to output terminal 6. Output control signal φAa is applied to each of the one input terminal of NAND gates G1 and G2.

When output control signal φAa of a H level is applied, output buffer circuit 2 is activated, whereby data RD and $\overline{RD}$ applied to the other output terminals of NAND gates G1 and G2 are directly output. Therefore, data RD applied to output buffer circuit 2 is provided to the gate electrode of transistor Q1 at the same logic level. Also, data RD is inverted by inverter I2. The inverted data $\overline{RD}$ is applied to the gate electrode of transistor Q2. Therefore, output data Dout of a logic level identical to that of data RD applied to output buffer circuit 2 is provided from output terminal 6.

When output control signal φAa of a L level is applied, output buffer circuit 2 is deactivated, whereby NAND gates G1 and G2 are always output a signal of a H level regardless of data RD and $\overline{RD}$ applied to the other input terminals. As a result, a signal of a L level is applied to the gate electrodes of transistors Q1 and Q2. Transistors Q1 and Q2 both attain a non conductive state. Therefore, output terminal 6 attains a floating state to attain a high impedance state.

Control circuit 20 includes an extend control circuit 4, an output control circuit 5, six inverters I8–I13, and NAND gates G3 and G4.

Extend control circuit 4 responds to internal control signals int. $\overline{RAS}$, int. $\overline{CAS}$, int. $\overline{OE}$, and int. $\overline{WE}$ to generate extend control signal φB. Output control circuit 5 responds to internal control signal int. $\overline{RAS}$, int. $\overline{CAS}$, int. $\overline{OE}$ and int. $\overline{WE}$ to generate output control signal φA. Inverters I8–I12 and NAND gate G3 form a one shot circuit that generates a short pulse in response to the rise of extend control signal φB.

Figure 3:
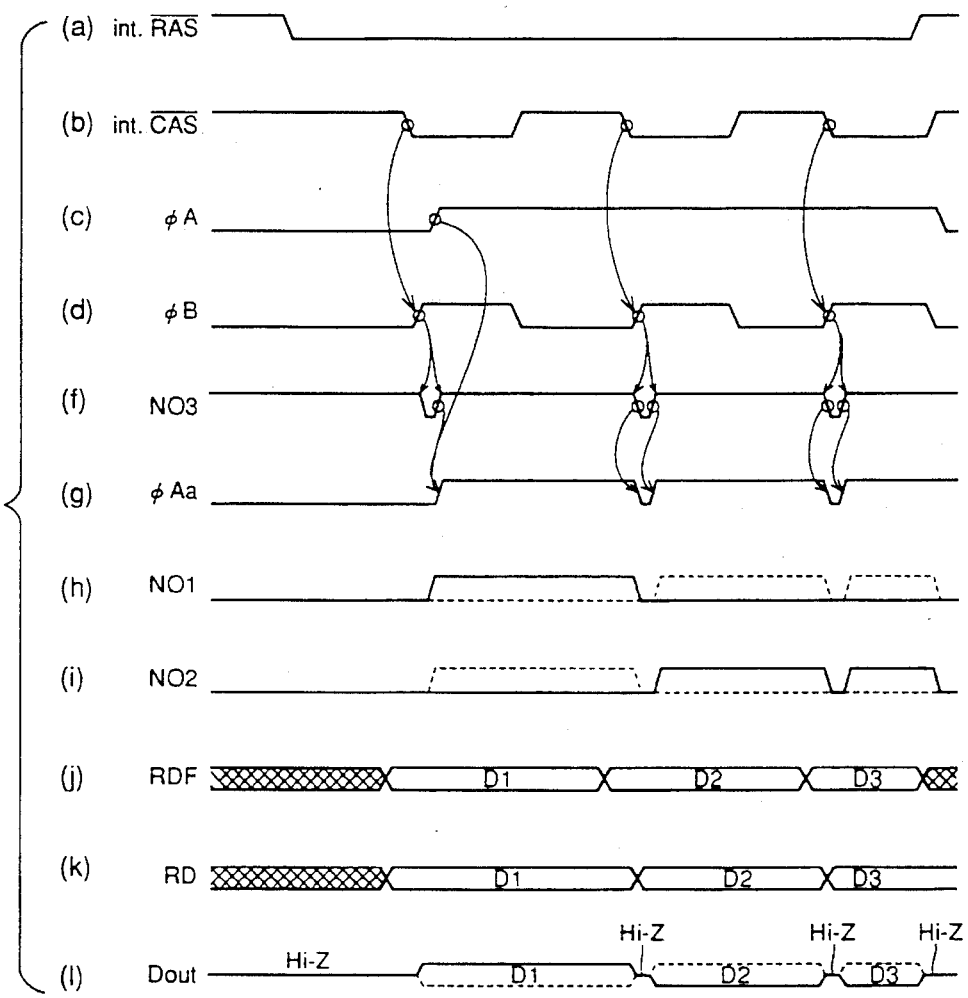
FIG. 3 is a timing chart showing the operation of the DRAM of FIGS. 1 and 2.

The operation of this DRAM will be described hereinafter. FIG. 3 is a timing chart showing the page mode operation of this DRAM.

Referring to FIG. 3, a row address is strobed in response to the fall of internal row address strobe signal int. $\overline{RAS}$, and a column address is strobed in response to the fall of internal column address strobe signal int. $\overline{CAS}$.

One memory cell is selected from memory cell array 11 according to these strobed row and column addresses. Data is read out via output circuit 16 from the selected memory cell. The read out data is amplified by preamplifier 19 to be applied to data extending circuit 1 as data RDF.

When internal row address strobe signal int. $\overline{RAS}$ falls and internal column address strobe signal int. $\overline{CAS}$ also rises, output control signal φA generated by output control circuit 5 rises to a H level from a L level. Output control signal φA is maintained at a H level until internal row address strobe signal int. $\overline{RAS}$ and internal column address strobe signal int. $\overline{CAS}$ both return to a H level.

Here, extend control signal φB generated by extend control circuit 4 rises and falls in response to the fall and rise, respectively, of internal column address strobe signal int. $\overline{CAS}$.

A one shot circuit formed by inverters I8–I12 and NAND gate G3 responds to a rise of extend control signal φB to generate a pulse of a predetermined width. Therefore, the potential of a node NO3 falls from a H level to a L level in response to a rise of extend control signal φB, and then rises from the L level to a H level after a predetermined time period. The width of this one shot pulse is determined by the delay time of inverters I8–I12.

The potentials of output control signal φA and node NO3 are applied to NAND gate G4, whereby output control signal φAa which is a logical product thereof is output from inverter I13. This output control signal φAa is pulled up to a H level from a L level when internal column address strobe signal int. $\overline{CAS}$ first falls to a L level from a H level. When internal column address strobe signal int. $\overline{CAS}$ falls again, output control signal φAa attains a L level for a predetermined time period.

When extend control signal φB attains a H level, data RDF provided from preamplifier 19 is output as data RD via inverters I6 and I4. When output control signal φAa attains a H level, data RD output from data extending circuit 1 is applied to the gate electrode of transistor Q1 via NAND gate G1 and inverter I1. At the same time, data signal RD is inverted by inverter I2. The inverted data $\overline{RD}$ is applied to the gate electrode of transistor Q2 via NAND gate G2 and inverter I3.

Therefore, when data RD attains a H level, gate node NO1 of transistor Q1 attains a H level, and gate node NO2 of transistor Q2 attains a L level. This causes transistor Q1 to be rendered conductive and transistor Q2 to be rendered nonconductive, whereby data D1 of a H level is output from output terminal 6.

When extend control signal φB attains a L level, data RDF from preamplifier circuit 19 is blocked. Data going through data extending circuit 1 is held by the latch circuit formed by inverters I4 and I5. The data is continuously held during a L level of extend control signal φB.

When extend control signal φB rises, the latched data D1 is reset, and the next data D2 begins to be output from data extending circuit 1.

Because output control signal φAa attains a L level for a predetermined time period in response to the rise of extend control signal φB, output buffer circuit 2 is deactivated for that predetermined time period. As a result, gate nodes NO1 and NO2 of transistors Q1 and Q2, respectively, both attain a L level. This renders transistors Q1 and Q2 both nonconductive, whereby output terminal 6 attains a high impedance state.

When output control signal φAa returns to a H level, output buffer circuit 2 is activated again, whereby the next data D2 is output via output terminal 6.

If data D2 attains a L level, for example, here, node NO1 attains a L level and node NO2 attains a H level. As a result, transistor Q1 is rendered nonconductive, and transistor Q2 is rendered conductive, whereby data D2 of a L level is output.

Even when data D2 of a L level is output succeeding data D1 of a L level, output terminal 6 attains a high impedance state Hi-Z from a H level, and then attains a L level. Therefore, ringing does not easily occur in comparison with the case where output terminal 6 is pulled down to a L level from a H level at once.

According to the present Embodiment 1, output data Dout is altered via a high impedance state Hi-Z. Therefore, ringing does not occur at the beginning of output data Dout. Because output data Dout can be used as valid data from the beginning, valid data can easily be obtained according to an EDO operation even when the read out speed is increased.

Furthermore, because one of transistors Q1 and Q2 attains an nonconductive state and the other attains an conductive state after transistors Q1 and Q2 both conduct, through current will not flow, and consumed power is reduced.

In Embodiment 1, row decoder 14, column decoder 15 and input/output circuit 16 correspond to a read out circuit that sequentially reads out data stored in each memory cell in response to predetermined read out control signals int. $\overline{RAS}$ and int. $\overline{CAS}$. Control circuit 20 includes a circuit responsive to a read out control signal for generating an extend control signal φB of a H level for a predetermined time period during data read out, and a circuit responsive to a read out control signal for generating an output control signal φAa of a L level for a predetermined time period after extend control signal φB is brought to a H level from a L level.

In Embodiment 1, the last stage of output buffer circuit 2 is formed by an N—N buffer. However, it may be formed by the so-called CMOS buffer. More specifically, a P channel MOS transistor may be used instead of N channel MOS transistor Q1. Inverter I1 can be removed, and the output of NAND gate G1 may be directly applied to the gate electrode of that P channel MOS transistor.

Although output control signal φAa attains a L level right after extend control signal φB is pulled up to a H level in Embodiment 1, output control signal φAa may be pulled down to a L level right before extend control signal φB is pulled up to a H level. Alternatively, output control signal φAa may be pulled down to a L level right before or right after extend control signal φB attains a H level.

[Embodiment 2]

Figure 4:
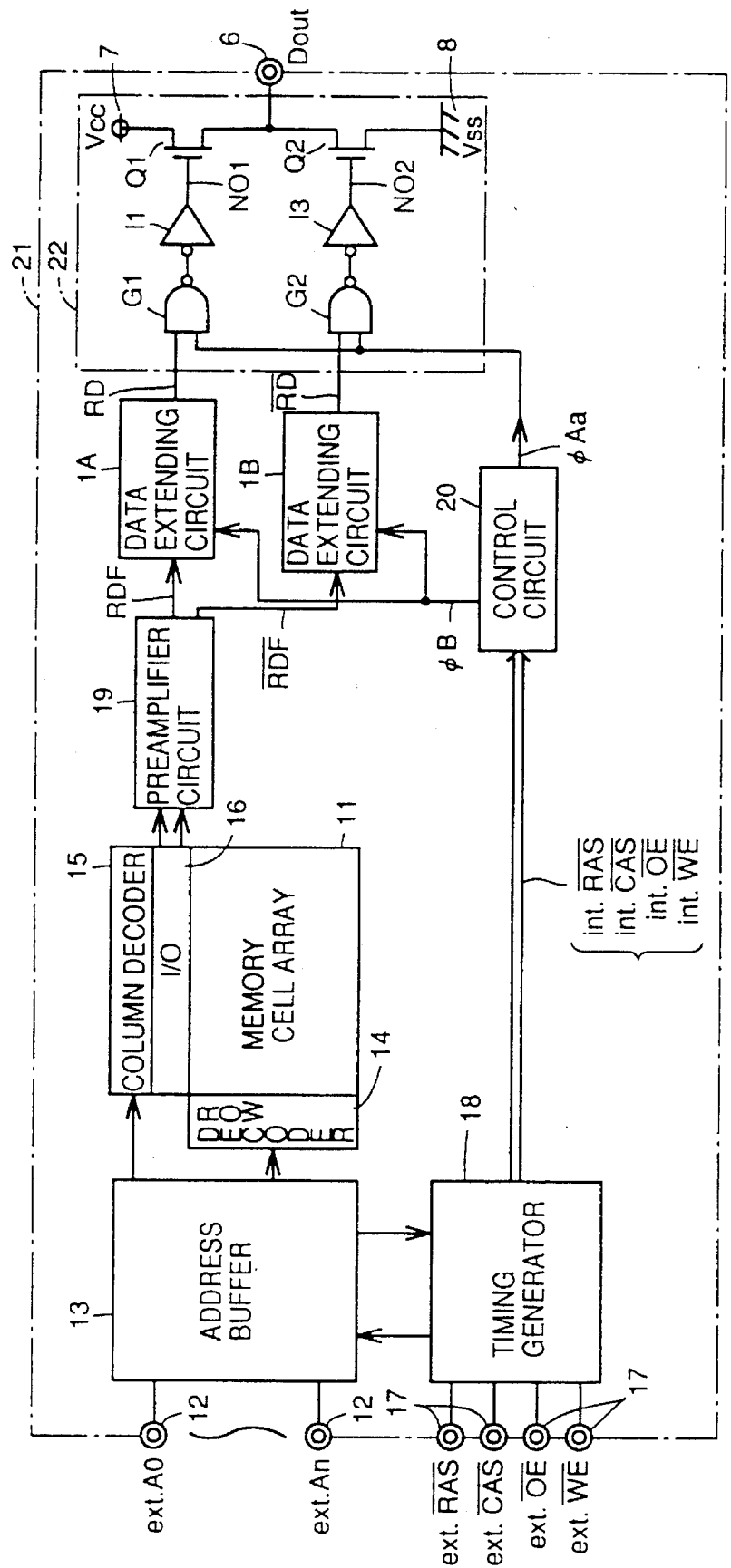
FIG. 4 is a block diagram showing the entire structure of a DRAM according to Embodiment 2 of the present invention.

FIG. 4 is a block diagram showing an entire structure of a DRAM according to Embodiment 2 of the present invention.

Embodiment 2 has the present invention applied to the case where data is output in a complementary manner from input/output circuit 16 and preamplifier circuit 19. Differing from the above-described Embodiment 1, the DRAM of Embodiment 2 includes two data extending circuits 1A and 1B. Data extending circuit 1A responds to extend control signal φB to extend data RDF until a predetermined time and outputs the same as data RD. Data extending circuit 1B responds to extend control signal φB to extend data $\overline{\text{RDF}}$ complementary to data RDF until a predetermined time and provides the same as data $\overline{\text{RD}}$.

Differing from output buffer circuit 2 of Embodiment 1, output buffer circuit 22 does not include inverter I2. More specifically, data $\overline{\text{RD}}$ from data extending circuit 1B is directly applied to NAND gate G2.

Thus, the present invention is also applicable in the case where complementary data RDF and $\overline{\text{RDF}}$ are output from preamplifier circuit 19.

[Embodiment 3]

Figure 5:
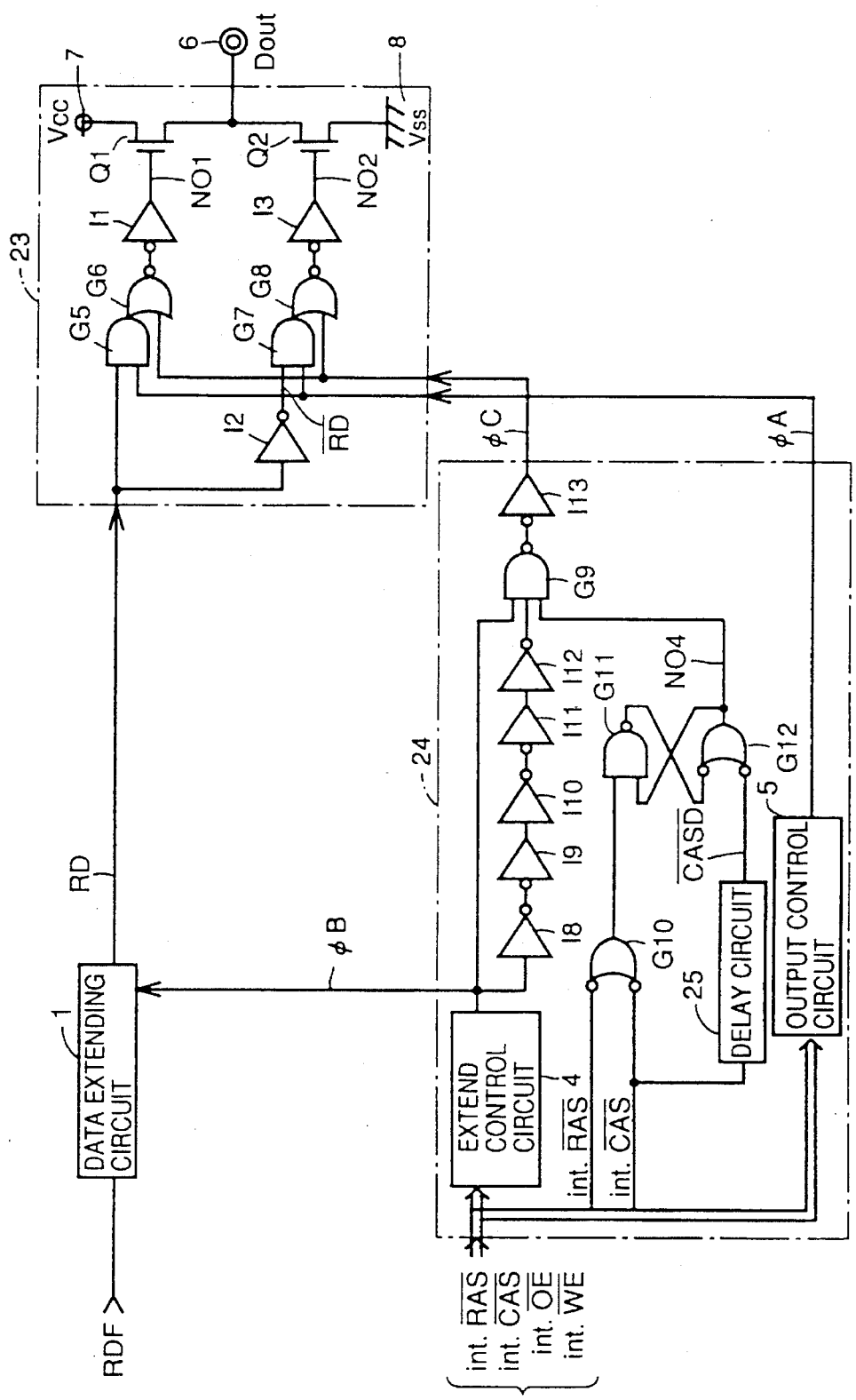
FIG. 5 is a block diagram showing the main structure of a DRAM according to Embodiment 3 of the present invention.

FIG. 5 is a block diagram showing the structures of a data extending circuit, an output buffer circuit, and a control circuit in a DRAM according to Embodiment 3 of the present invention.

Referring to FIG. 5, this DRAM includes a data extending circuit 1, an output buffer circuit 23, and a control circuit 24. This DRAM further comprises a memory cell array, a row decoder, and a column decoder (not shown) as in Embodiment 1.

Data extending circuit 1 is identical to that of Embodiment 1. Similar to output buffer circuit 2 of Embodiment 1, output buffer circuit 23 includes two N channel MOS transistors Q1 and Q2, and three inverters I1–I3. Differing from output buffer circuit 2 of Embodiment 1, output buffer circuit 23 further includes AND gates G5 and G7, and NOR gates G6 and G8.

Data RD provided from data extending circuit 1 is applied to one input terminal of AND gate G5, and is also inverted by inverter I2. The inverted data $\overline{\text{RD}}$ is applied to one input terminal of AND gate G7.

The output signals of AND gates G5 and G7 are applied to one input terminals of NOR gates G6 and G8, and output signals of NOR gates G6 and G8 are applied to the gate electrodes of transistors Q1 and Q2 via inverters I1 and I3.

Similar to control circuit 20 of Embodiment 1, control circuit 24 includes an extend control circuit 4, an output control circuit 5, and six inverters I8–I13. Different from control circuit 20 of Embodiment 1, control circuit 24 includes a 3-input NAND gate G9, three NAND gates G10–G12, and a delay circuit 25.

NAND circuit G10 receives internal row address strobe signal int. $\overline{\text{RAS}}$ and internal column address strobe signal int. $\overline{\text{CAS}}$. Delay circuit 25 responds to internal column address strobe signal int. $\overline{\text{CAS}}$ to generate a delayed column address strobe signal $\overline{\text{CASD}}$.

Here, NAND gates G11 and G12 form a latch circuit. This latch circuit responds to a fall of a delayed column address strobe signal $\overline{\text{CASD}}$ to latch an output signal from NAND gate G10.

3-input NAND gate G9 receives extend control signal φB from extend control circuit 4, a signal which is extend control signal φB delayed by five inverters I8–I12, and an output signal of the latch circuit including NAND gates G11 and G12. The output signal of 3-input NAND gate G9 is inverted by inverter I13 to be output as an output control signal φC.

Extend control circuit 4 and output control circuit 5 are similar to the extend control circuit and the output control circuit, respectively, of Embodiment 1. Extend control circuit 4 responds to an internal control signal to generate extend control signal φB. Output control circuit 5 responds to an internal control signal to generate output control signal φA.

Output control signal φA is applied to the other input terminals of AND gates G5 and G7 in output buffer circuit 23. Output control signal φC is applied to the other input terminals of NOR gates G6 and G8.

Figure 6:
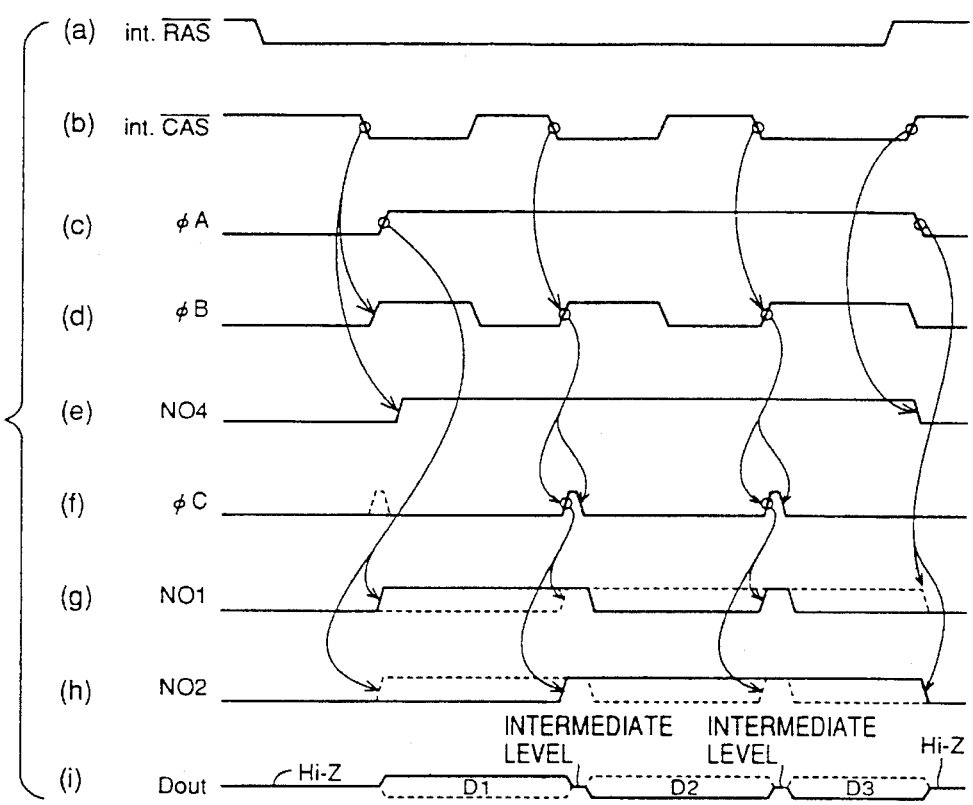
FIG. 6 is a timing chart showing the operation of the DRAM of FIG. 5.

The operation of this DRAM will be described hereinafter with reference to the timing chart of FIG. 6 showing a page mode operation thereof.

Similar to Embodiment 1, extend control signal φA is pulled up to a H level when internal row address strobe signal int. $\overline{\text{RAS}}$ falls and then internal column address strobe signal int. $\overline{\text{CAS}}$ falls. Also similar to Embodiment 1, extend control signal φB rises and falls in response to a fall and rise, respectively, of internal column address strobe signal int. $\overline{\text{CAS}}$.

When extend control signal φB attains a H level, data RDF provided from the preamplifier circuit passes through data extending circuit 1 to be output as data RD.

The latch circuit formed of NAND gates G11 and G12 responds to a fall of a delayed control address strobe signal $\overline{\text{CASD}}$ to latch an output signal of NAND gate G10. Therefore output node NO4 attains a H level after a predetermined time period from the fall of internal column address strobe signal int. $\overline{\text{CAS}}$.

Similar to Embodiment 1, a one shot pulse φC is generated in response to a rise of extend control signal φB. This pulse is output as output control signal φC from control circuit 24 via inverter I13.

When output control signal φA attains a H level, output buffer circuit 23 is activated. When data RD from data extending circuit 1 attains a H level, gate node NO1 of transistor Q1 attains a H level and gate node NO2 of transistor Q2 attains a L level.

When extend control signal φB attains a H level again, the next data RD is applied to output buffer circuit 23. However, since output control signal φC attains a H level for a predetermined time period in response to a rise of this extend control signal φB, gate nodes NO1 and NO2 of transistors Q1 and Q2 are both forced to a H level. As a result, transistors Q1 and Q2 both attain a conductive state momentarily, and output terminal 6 is precharged to an intermediate level between power supply level Vcc and ground level Vss.

When output control signal φC returns to a L level, data RD which was applied to output buffer circuit 23 is provided from output terminal 6 as output data Dout. For example, when data RD attains a L level here, node NO1 is pulled to a L level in response to the fall of output control signal φC and node NO2 is pulled to a H level.

Thus, output data Dout attains a L level from a H level via an intermediate level, or a H level from a L level via an intermediate level. Therefore, ringing does not easily occur in comparison with the case where it changes from a H level to a L level, or a L level to a H level at once.

In Embodiment 3, one input node NO4 of 3-input NAND gate G9 attains a H level at an elapse of a predetermined time period from a fall of internal column address strobe signal int. $\overline{\text{CAS}}$. Therefore, a one shot pulse generated in response to a fall of internal column address strobe signal int. $\overline{\text{CAS}}$ is not output as output control signal φC at the first fall of internal column address strobe signal int. $\overline{\text{CAS}}$.

Therefore, output data Dout does not attain an intermediate level right before the output of the first data D1 after the fall of internal column address strobe signal int. $\overline{RAS}$. However, since output terminal 6 attains a high impedance state Hi-Z right before the first data D1 is output, ringing does not occur.

Also, since transistors Q1 and Q2 do not attain a conductive state at the same time right before the output of the first data D1, through current will not flow at this time. Therefore, power consumption is reduced in comparison with the case where data Dout is rendered to an intermediate level right before output of each data.

[Embodiment 4]

Figure 7:
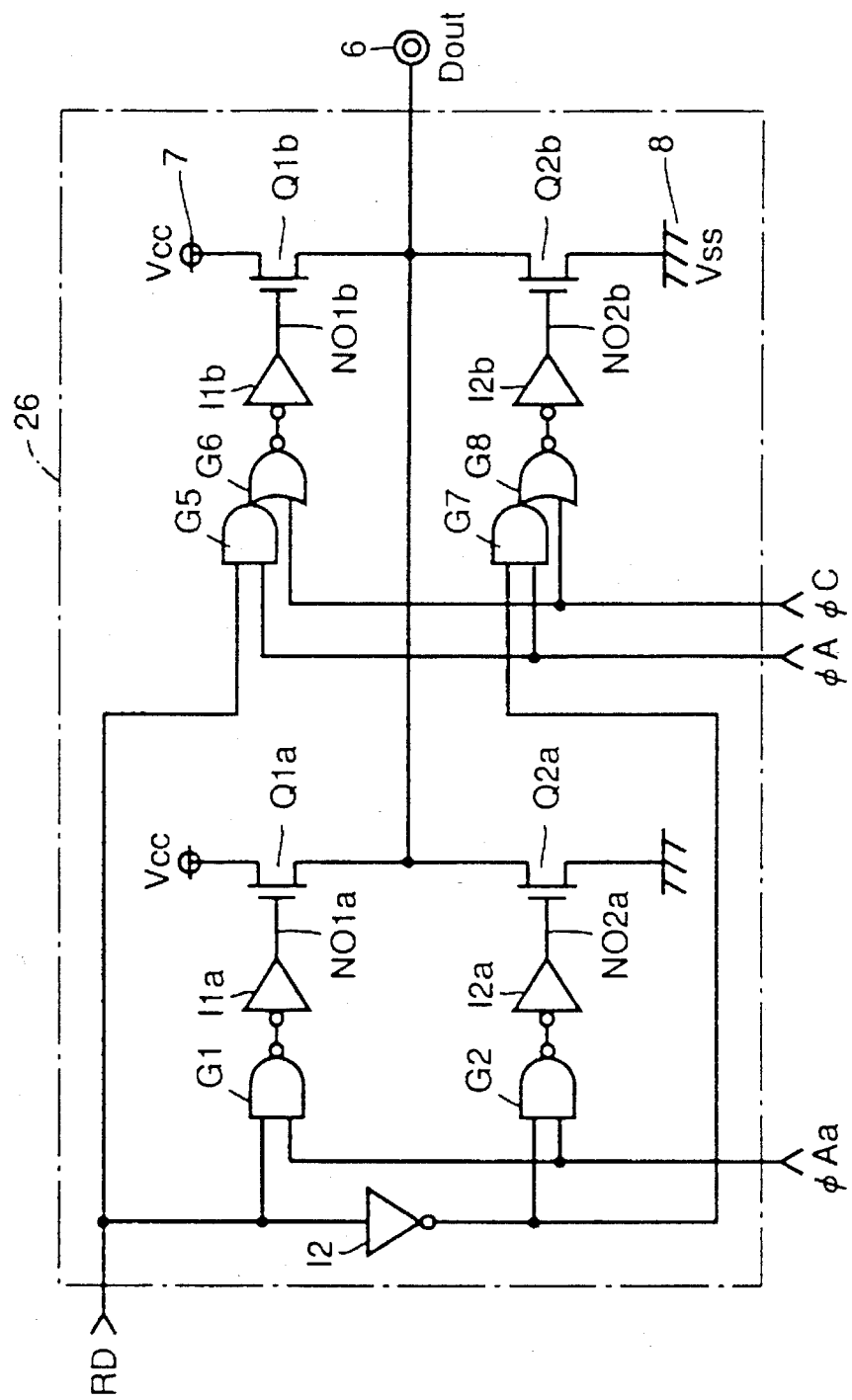
FIG. 7 is a circuit diagram showing the main structure of a DRAM according to Embodiment 4 of the present invention.

FIG. 7 is a circuit diagram showing a structure of an output buffer circuit in a DRAM according to Embodiment 4.

Referring to FIG. 7, output buffer circuit 26 of the present DRAM includes the output buffer circuit of Embodiment 1 and the output buffer circuit of Embodiment 3.

More specifically, output buffer circuit 26 includes two N channel MOS transistors Q1a and Q2a, two NAND gates G1 and G2, and three inverters I1a, I2a and I2c. They correspond to output buffer circuit of Embodiment 1.

Output buffer circuit 26 further includes two N channel MOS transistors Q1b and Q2b, two NAND gates G5 and G7, two NOR gates G6 and G8, and two inverters I1b and I2b. These elements and inverter I2 correspond to output buffer circuit 23 of Embodiment 3.

Transistors Q1b and Q2b have the size set smaller than the size of transistors Q1a and Q2a.

According to output buffer circuit 26, transistors Q1a and Q2a are both rendered nonconductive, and transistors Q1b and Q2b are simultaneously rendered conductive at the same time, right before output data Dout is provided from output terminal 6. As a result, output terminal 6 attains a high impedance state, and is precharged to an intermediate level.

Thus, output data Dout is temporarily set to an intermediate level in falling to a L level from a H level or when rising to a H level from a L level. Therefore, ringing does not occur at the beginning of output data Dout.

Because the size of transistors Q1b and Q2b for setting output terminal 6 to an intermediate level is small, the through current that flows when transistors Q1b and Q2b both conduct is low. However, output terminal 6 can be precharged sufficiently to the intermediate level since it is set to a high impedance state.

[Embodiment 5]

Figure 8:
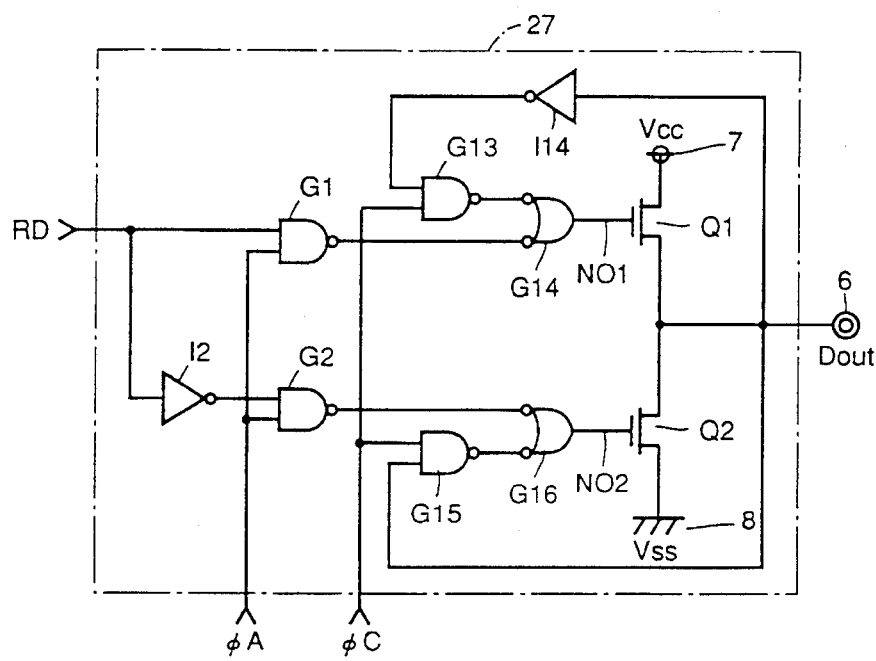
FIG. 8 is a circuit diagram showing the main structure of a DRAM according to Embodiment 5 of the present invention.

FIG. 8 is a circuit diagram showing a structure of an output buffer circuit of a DRAM according to Embodiment 5 of the present invention.

Referring to FIG. 8, an output buffer circuit 27 of the present DRAM includes two N channel MOS transistors Q1 and Q2, two NAND gates G1 and G2, and an inverter I2, as in Embodiment 1. Differing from Embodiment 1, output buffer circuit 27 further includes four NAND gates G13–G16, and an inverter I14.

Output control signal φC generated by control circuit 24 of Embodiment 3 is applied to the one input terminals of NAND gates G13 and G15. Output data Dout is fed back via inverter I14 to the other input terminals of NAND gates G13. Output data Dout is directly fed back to the other input terminal of NAND gate G15.

The output signals of NAND gates G1 and G3 are applied to NAND gate G14. An output signal thereof is applied to the gate electrode of transistor Q1. The output signals of NAND gates G2 and G15 are applied to NAND gate G16. An output signal thereof is applied to the gate of transistor Q2.

Figure 9:
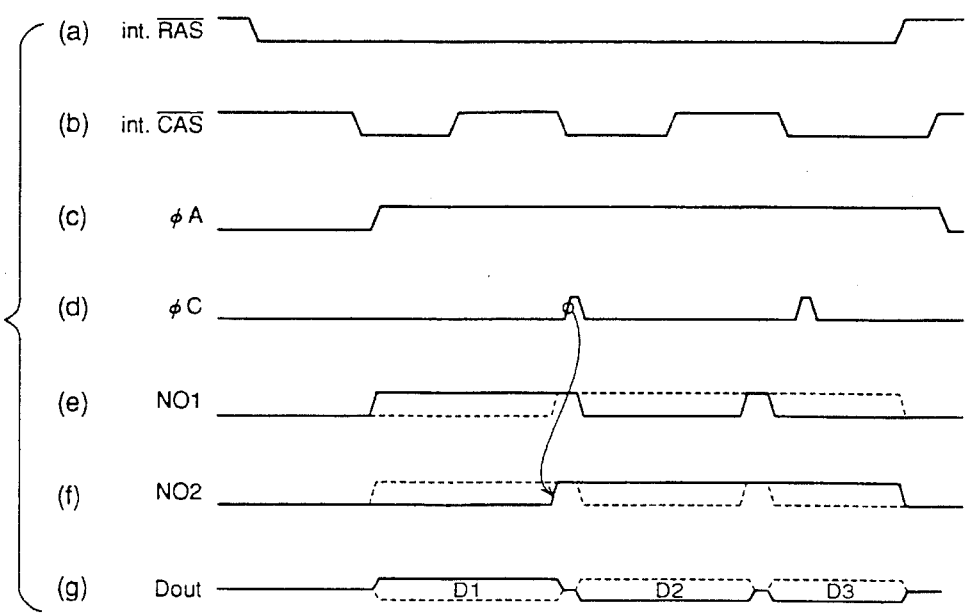
FIG. 9 is a timing chart showing the operation of the DRAM of FIG. 8.

The operation of this DRAM will be described hereinafter with reference to the timing chart of FIG. 9 showing a page mode operation thereof.

When data RD of, for example, a H level is applied in response to a fall of internal column address strobe signal int. $\overline{CAS}$, gate node NO1 of transistor Q1 attains a H level and gate node NO2 of transistor Q2 attains a L level. This renders transistor Q1 conductive, and transistor Q2 nonconductive, whereby data D1 of a H level is provided from output terminal 6 as output data Dout.

When output control signal φC of a H level is instantaneously applied to the one input terminals of NAND gates G13 and G15 immediately before the next data D2 is output, data D1 and $\overline{D1}$ applied to the other input terminals of NAND gates G13 and G15 are inverted to be respectively output from NAND gates G13 and G15. According to the previous data D1, a signal of a L level is applied to gate node NO1 of transistor Q1 and a H level is applied to gate node NO2 of transistor Q2. This causes transistor Q1 to go into non-conduction and transistor Q2 into conduction. Therefore, output data Dout rapidly falls towards a L level from a H level.

When output control signal φC returns to a L level, if the next data RD is, for example, low, node NO1 attains a L level and node NO2 attains a H level. As a result, transistor Q1 is rendered nonconductive and transistor Q2 is rendered conductive, whereby output data Dout attains a L level.

Conversely, when the applied data RD rises to a H level from a L level, output data Dout rapidly rises towards a H level from a L level right before the next data is output.

In Embodiment 5, output data Dout is temporarily set to an intermediate level between a H level and a L level right before the next data Dout is output. Therefore, ringing will not occur at the beginning of output data Dout in comparison with the case where data Dout rises to a H level from a L level or falls to a H level from a L level at once. Furthermore, because the potential of output terminal 6 is altered towards a level opposite to the current level right before the next data Dout is output, output data Dout can rapidly attain an intermediate level.

[Embodiment 6]

Figure 10:
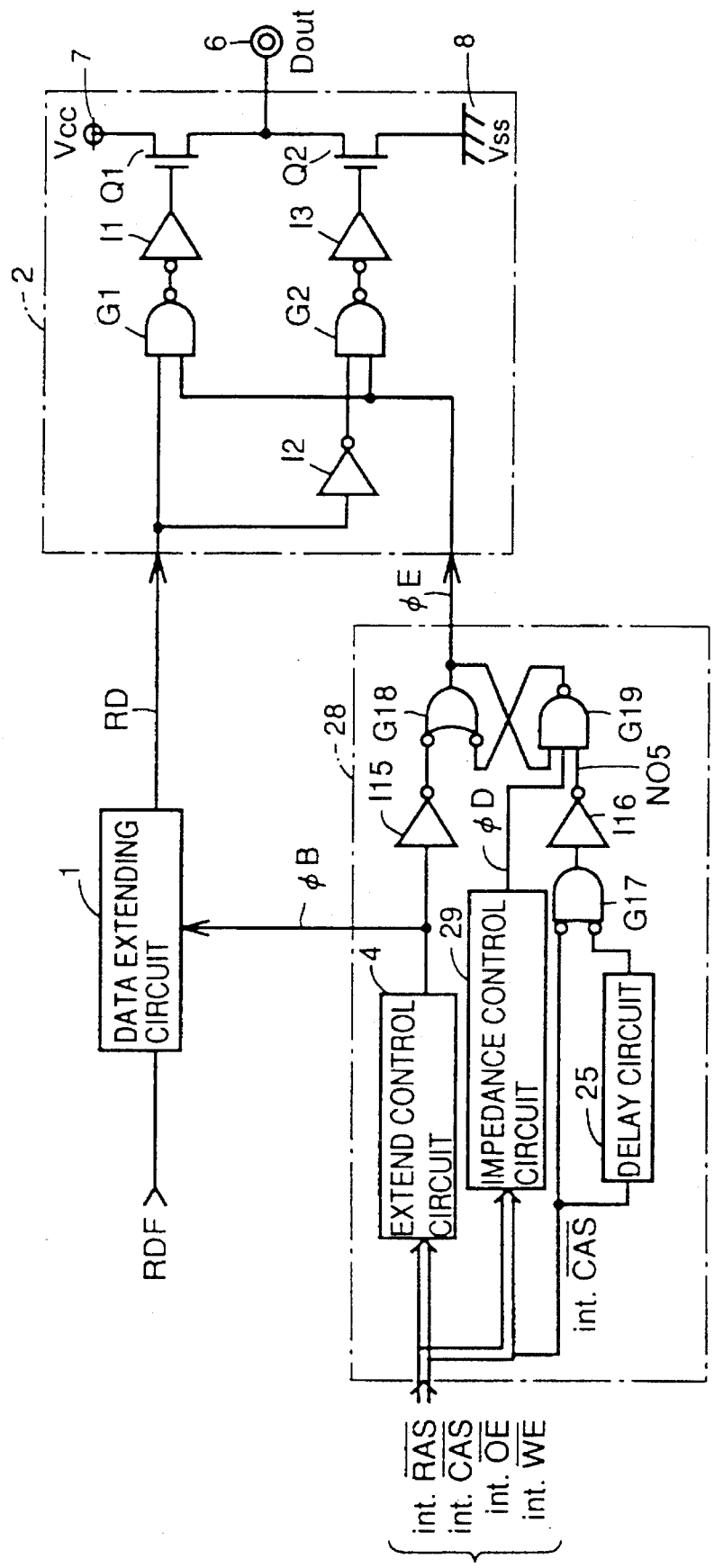
FIG. 10 is a block diagram showing the main structure of a DRAM according to Embodiment 6 of the present invention.

FIG. 10 is a block diagram showing the structures of a data extending circuit, an output buffer circuit, and a control circuit of a DRAM according to Embodiment 6 of the present invention.

Referring to FIG. 10, the present DRAM includes a data extending circuit 1, an output buffer circuit 2, and a control circuit 28 in addition to a memory cell array not shown.

The DRAM of the present Embodiment 6 differs from the DRAM of Embodiment 1 in control circuit 28. Control circuit 28 includes an extend control circuit 4, an impedance control circuit 29, a delay circuit 25, two inverters I15 and I16, and three NAND gates G17–G19. Here, NAND gates G18 and G19 form a latch circuit.

Extend control circuit 4 is similar to that of Embodiment 1, and generates extend control signal φB. Extend control signal φB is applied to one input terminal of NAND gate G18 forming a latch circuit. Therefore, this latch circuit is set in response to a rise of extend control signal φB.

Impedance control circuit 29 generates an impedance control signal φD that rises in response to a fall of internal row address strobe signal int. $\overline{RAS}$ and that falls in response to a rise of both internal column address strobe signal int. $\overline{RAS}$ and internal column address strobe signal int. $\overline{CAS}$. In response to impedance control signal φD, the latch circuit formed of NAND gates G18 and G19 are activated.

NAND gate G17 has one input terminal directly applied with internal column address strobe signal int. $\overline{CAS}$ and the other input terminal applied with an internal column address strobe signal delayed by delay circuit 25. An output signal of NAND gate G17 is applied to one input terminal of NAND gate G19 forming a latch circuit via inverter I16. Therefore, this latch circuit is reset in response to a fall of internal column address strobe signal int. $\overline{CAS}$. An output signal of this latch circuit is provided to output buffer circuit 2 from control circuit 28 as an output control signal φE.

Figure 11:
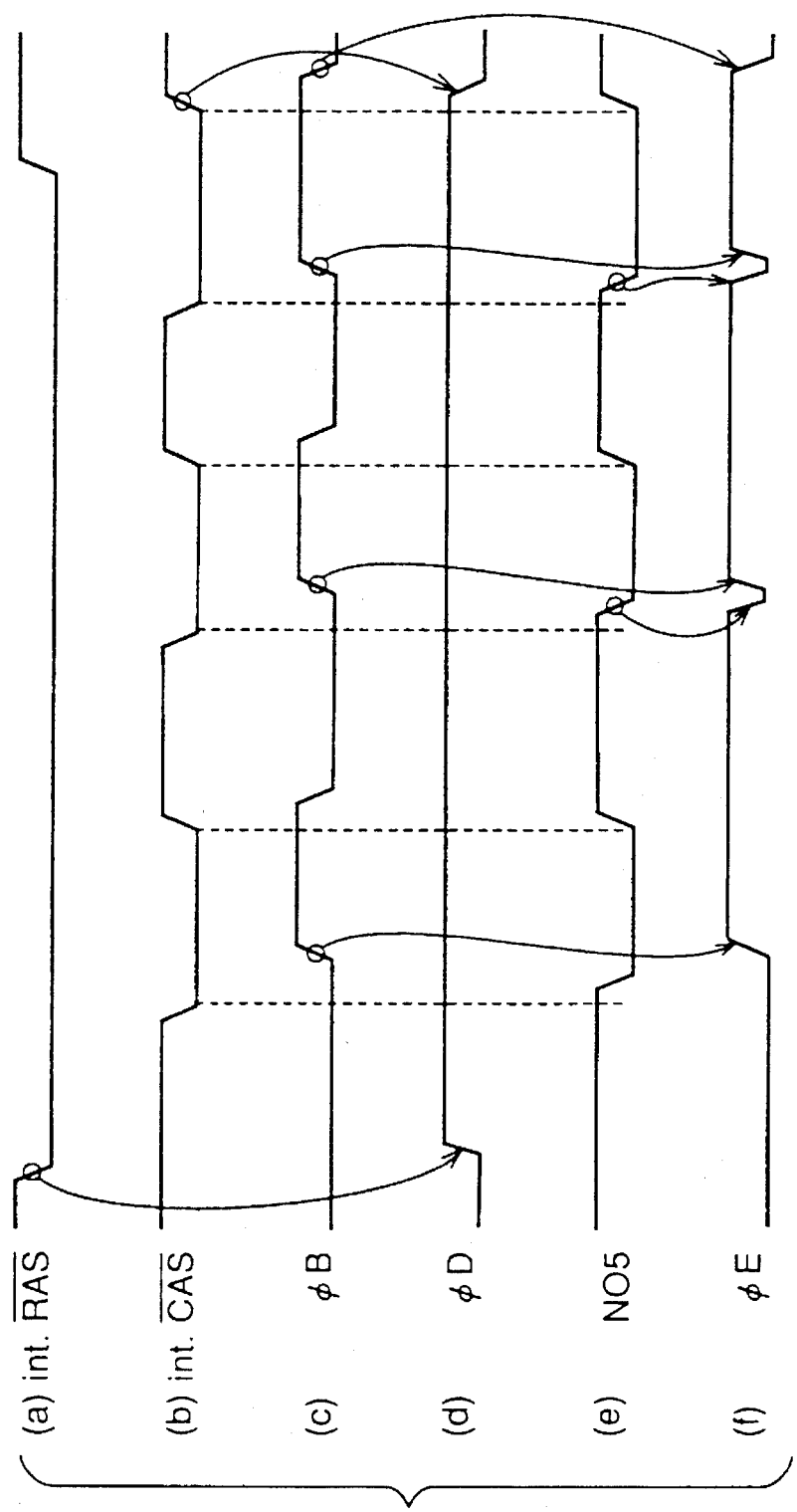
FIG. 11 is a timing chart showing the operation of the DRAM of FIG. 10.
Figure 12:
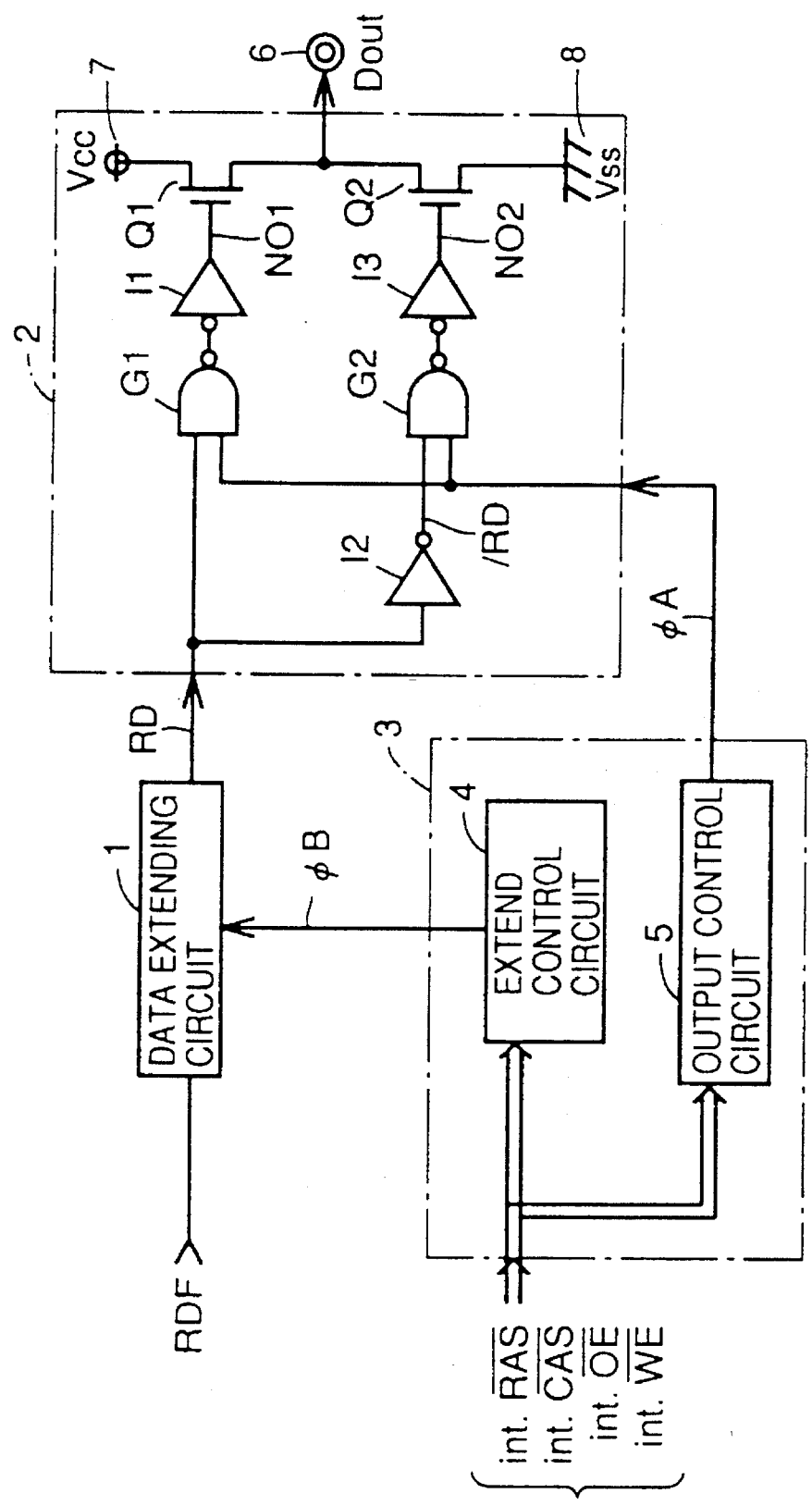
FIG. 12 is a diagram for describing the object of the present invention, and shows a block diagram of the main structure of a DRAM including an EDO function.
Figure 13:
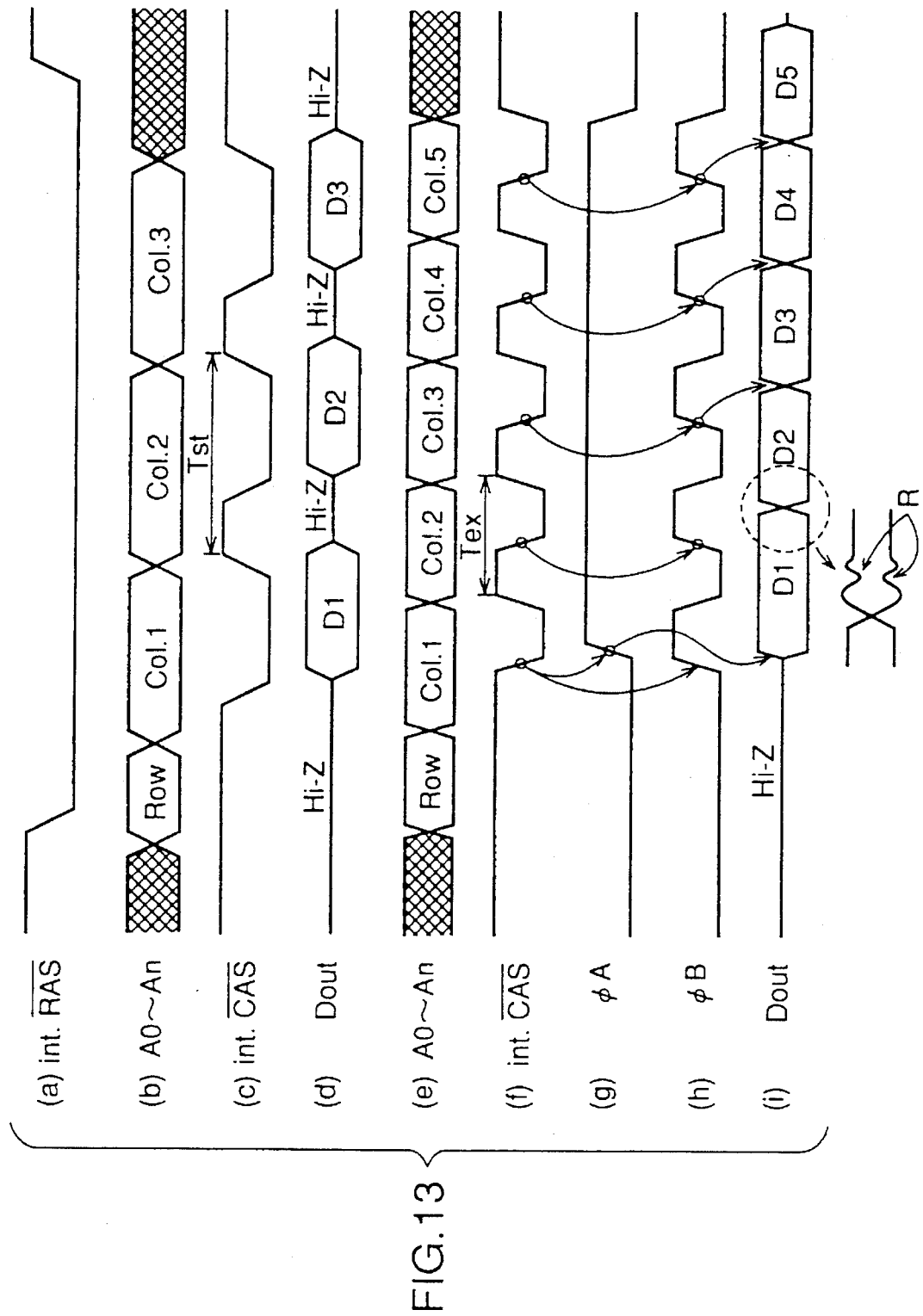
FIG. 13 is a timing chart showing the operation of the DRAM of FIG. 12.

An operation of the present DRAM will be described hereinafter with reference to the timing chart of FIG. 11 showing a page mode operation thereof.

Referring to FIG. 11, impedance control signal φD rises in response to a fall of internal row address strobe signal int. $\overline{RAS}$, whereby the latch circuit is activated.

The latch circuit is reset in response to a fall of internal column address strobe signal int. $\overline{CAS}$. When extend control signal φB rises, the latch circuit is set, whereby output control signal φE attains a H level.

In response to a fall of internal column address strobe signal int. $\overline{CAS}$, the latch circuit is reset, and output control signal φE attains a L level. When extend control signal φB rises right thereafter, the latch circuit is set again, and output control signal φE attains a H level.

In Embodiment 6, output control signal φE rises in response to a rise of extend control signal φB. Therefore, when data RDF applied to data extending circuit 1 passes through data extending circuit 1 to be provided to output buffer circuit 2 as data RD, it will be immediately output from output terminal 6 as output data Dout.

Furthermore, because output terminal 6 attains a high impedance state in response to the fall of internal column address strobe signal int. $\overline{CAS}$ and a rise of extend control signal φB, output terminal 6 attains a high impedance state at a more accurate timing than in Embodiment 1 where a one shot pulse circuit is used. Therefore, ringing that occurs at the beginning of the output data can reliably be reduced.

Although Embodiment 6 has the output terminal rendered to a high impedance state right before the next data is output, the output terminal may be rendered to an intermediate level at a timing as accurate as in Embodiment 6.

Furthermore, the output terminal may be rendered to a high impedance state and also to an intermediate level at an accurate timing as in Embodiment 6.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

an output terminal, a plurality of memory cells, each storing 1 bit of data therein, read out means for sequentially reading out data stored in said memory cells, extending means for extending each data read out from said read out means, providing means responsive to extended data from said extending means for providing output data sequentially to said output terminal, and high impedance state rendering means for rendering said output terminal to a high impedance state before each output data is provided by said providing means.

2. The semiconductor memory device according to claim 1, wherein said providing means includes a first transistor connected between a first node to which a first potential is supplied and said output terminal, being turned on in response to the extended data, a second transistor connected between a second node to which a second potential is supplied and said output terminal, being turned on in response to the extended data and complementarily to said first transistor, wherein said high impedance state rendering means renders said first and second transistors both to an off state before each output data is supplied by said providing means.

3. The semiconductor memory device according to claim 1, wherein said extending means includes passage means for passing the read out data therethrough, and latch means for latching each data passing through said passage means until subsequent data is read out.

4. A semiconductor memory device comprising:

an output terminal, a plurality of memory cells, each storing 1 bit of data therein, read out means responsive to a predetermined read out control signal for sequentially reading out data stored in said memory cells, control means including first generation means responsive to said read out control signal for generating an extend control signal of a first logic level for a predetermined time period during read out of each data by said read out means, and second generation means responsive to said read out control signal for generating an output control signal of a second logic level for a predetermined time period before or after said extend control signal is altered from a third logic level to the first logic level, extending means including passage means for passing data read out from said read out means therethrough during said extend control signal attaining the first logic level, and latch means for latching the data passing through said passage means during said extend control signal attaining the third logic level, providing means responsive to data provided from said extending means for providing output data to said output terminal during said output control signal attaining a fourth logic level, and high impedance state rendering means for rendering said output terminal to a high impedance state during said output control signal attaining the second logic level.

5. The semiconductor memory device according to claim 4, wherein said providing means includes a first transistor connected between a first node to which a first potential is supplied and said output terminal, being turned on in response to data provided from said extending means, and a second transistor connected between a second node to which a second potential is supplied and said output terminal, being turned on in response to data supplied from said extending means and complementarily to said first transistor, wherein said high impedance state rendering means renders said first and second transistors both to an off state before each output data is provided by said providing means.

6. The semiconductor memory device according to claim 4, wherein said second generation means includes means responsive to said read out control signal for rendering said output control signal to the second logic level, and means responsive to said extend control signal for rendering said output control signal to the fourth logic level.

7. The semiconductor memory device comprising:

an output terminal, a plurality of memory cells, each storing 1 bit of data therein, read out means for sequentially reading out data stored in said memory cells, extending means for extending each data read out from said read out means, providing means responsive to extended data from said extending means for providing output data sequentially to said output terminal, and deactivating means for deactivating said providing means before each output data is provided by said providing means.

* * * * *